United States Patent
Barabash

(10) Patent No.: US 6,897,373 B2
(45) Date of Patent: May 24, 2005

(54) RADIATING ENCLOSURE

(75) Inventor: Darrell W. Barabash, Grapevine, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/316,706

(22) Filed: Dec. 11, 2002

(65) Prior Publication Data

US 2003/0121686 A1 Jul. 3, 2003

Related U.S. Application Data

(63) Continuation of application No. 09/316,459, filed on May 21, 1999, now Pat. No. 6,563,042.

(51) Int. Cl.⁷ .................................................. H05K 9/00
(52) U.S. Cl. ............................... 174/35 R; 174/35 MS; 174/35 GC; 174/35 C; 174/52.1; 361/816; 361/818; 343/700; 343/702; 343/895
(58) Field of Search .......................... 174/35 R, 35 MS, 174/35 CG, 35 C, 52.1; 361/816, 818; 343/700, 702, 895

(56) References Cited

U.S. PATENT DOCUMENTS

| | | |
|---|---|---|
| 4,323,900 A | 4/1982 | Krall et al. |
| 4,821,041 A | 4/1989 | Evans |
| 4,894,663 A | 1/1990 | Urbish et al. |
| 5,093,670 A | 3/1992 | Braathen |
| 5,410,749 A | 4/1995 | Siwiak et al. |
| 5,633,645 A | 5/1997 | Day |
| 5,694,135 A | 12/1997 | Dikun et al. |
| 5,706,019 A | 1/1998 | Darden, IV et al. |
| 5,717,160 A | 2/1998 | Bootle |
| 5,743,568 A | 4/1998 | Smith, III |
| 5,748,155 A | 5/1998 | Kadunce et al. |
| 5,861,019 A | 1/1999 | Sun et al. |
| 5,952,975 A | 9/1999 | Pedersen et al. |
| 6,005,527 A | 12/1999 | Gomez et al. |
| 6,053,777 A | 4/2000 | Boyle |
| 6,172,651 B1 | 1/2001 | Du |
| 6,459,916 B1 * | 10/2002 | Suguro ..................... 455/575.7 |
| 6,480,699 B1 * | 11/2002 | Lovoi ......................... 455/41.2 |
| 6,490,435 B1 * | 12/2002 | Ma et al. ................... 455/90.1 |

* cited by examiner

Primary Examiner—Dean A. Reichard
Assistant Examiner—Jinhee Lee
(74) Attorney, Agent, or Firm—Libby H. Hope

(57) ABSTRACT

An integrated radiating enclosure is disclosed. The enclosure housing is formed from a dielectric material with a radiating element formed on the exterior surface of the housing and a groundplane material formed on the interior of the housing. The groundplane provides EMI shielding for the enclosed electronics. The three antenna elements are directly connected to the circuitry of a transceiver system, thereby integrating the transceiver antenna components directly into the transceiver enclosure.

21 Claims, 5 Drawing Sheets

RADIATING ENCLOSURE

This application is a continuation application of U.S Pat. No. 6,563,042 issued on May 13, 2003, entitled "Radiating Enclosure".

FIELD OF INVENTION

The present invention pertains to the field of antenna systems including, more particularly, to embedded antenna systems.

BACKGROUND OF THE INVENTION

Radio transceiver circuitry for use with a local wireless loop or other type of radio frequency broadcast and receiving application, typically generates significant noise or electromagnetic interference (EMI). This interference can affect the reception or transmission quality, can lead to a weakened signal, can result in the unneeded use of power and can interfere with other radio receivers. To compensate for this problem, transceiver units are typically enclosed by a metallic casing. Metallic casing provide a way to shield the antenna system from the unwanted electromagnetic interference generated by the electronics. In modern mass production applications, a metallic casing of this type can become a significant portion of the overall production cost. As with any manufactured good, there is a desire to minimize production costs as well as the other costs associated with producing and distributing radio transceivers.

As a necessary part of their functionality, radio transceivers require an antenna system to effectively receive and transmit the signals to be processed. In known transceivers, the antenna system is often composed of a separate stand alone unit. U.S. Pat. No. 5,093,670 describes such a stand alone antenna structure for use in a wireless communication system. The antenna is distinct from the transceiver enclosure, either mounted directly to the enclosure or somewhere proximate to the enclosure. In this type of antenna application, there is a need for an electrical connection from the antenna components to the electronics housed within the enclosure. Most commonly, this connection is in the form of a detachable coaxial cable. Besides the cost of these cable connectors, the larger the distance the antenna is from the electronics, the longer the cable and the larger the cost of installation and manufacture. Additionally, signal strength is lost within longer cables, reducing the sensitivity of the receiver and requiring a transmitter with more power.

U.S. Pat. No. 4,894,663 describes a radio housing where a loop antenna is molded or embedded into the housing. The antenna functions independently from the housing itself does not form an active component of the loop antenna.

U.S. Pat. No. 5,694,135 describes a connector for use in a patch antenna system. The connector is an independent element which co-axially connects to two separate conductive materials on the patch antenna. However, the described connector still requires an additional link to the operating electronics being used with the antenna.

Each of the separate components of these known transceivers described above (the enclosure, the antenna, the cable, a connection device, mounting hardware for the antenna) not only require additional manufacturing steps, they all contribute to extra cost, space allocation and maintenance problems. Each of these additional components can also contribute to a lower radio sensitivity and poorer performance.

With the modern trend in telecommunications moving toward the wireless communications arena and everyday consumers beginning to become increasingly involved with the use of wireless systems, the use of these transceiver stations is becoming more and more widespread. It thus becomes even more desirable to seek cost and space reductions wherever possible in the production of wireless transceiver stations.

Known patch antenna systems include three main components: a metallic region or radiating element forming the active area of the antenna, a metallic groundplane region, and a dielectric region sandwiched between the groundplane region and the radiating element. In a typical patch antenna system, all of these individual components are incorporated into a separate antenna structure and are often contained in a non-metallic enclosure to provide environmental protection and to facilitate mounting on a wall, roof, tower and/or mast.

SUMMARY OF THE INVENTION

The present invention comprises a radiating enclosure comprising a formed dielectric material sandwiched between formed conductive materials. The radiating enclosure is preferably directly connected to transceiver circuitry mounted within the enclosure through an integrated connection device.

In one aspect of the present invention, the radiating enclosure comprises a dielectric housing with an interior surface and an exterior surface, at least one radiating element attached to the exterior surface of the housing, and a groundplane material distributed on the interior surface of the dielectric housing. The radiating enclosure also preferably includes a connection device. The connection device preferably connects the radiating enclosure to the transceiver system through a controller impedance interface.

In another aspect, the present invention also includes a method for manufacturing a radiating enclosure comprising forming a housing from a dielectric material, applying a groundplane material to the interior surface of the housing and attaching a radiating element to the exterior surface of the housing.

DETAILED DESCRIPTION OF PREFERRED EMBODIMENTS

Figure 1:
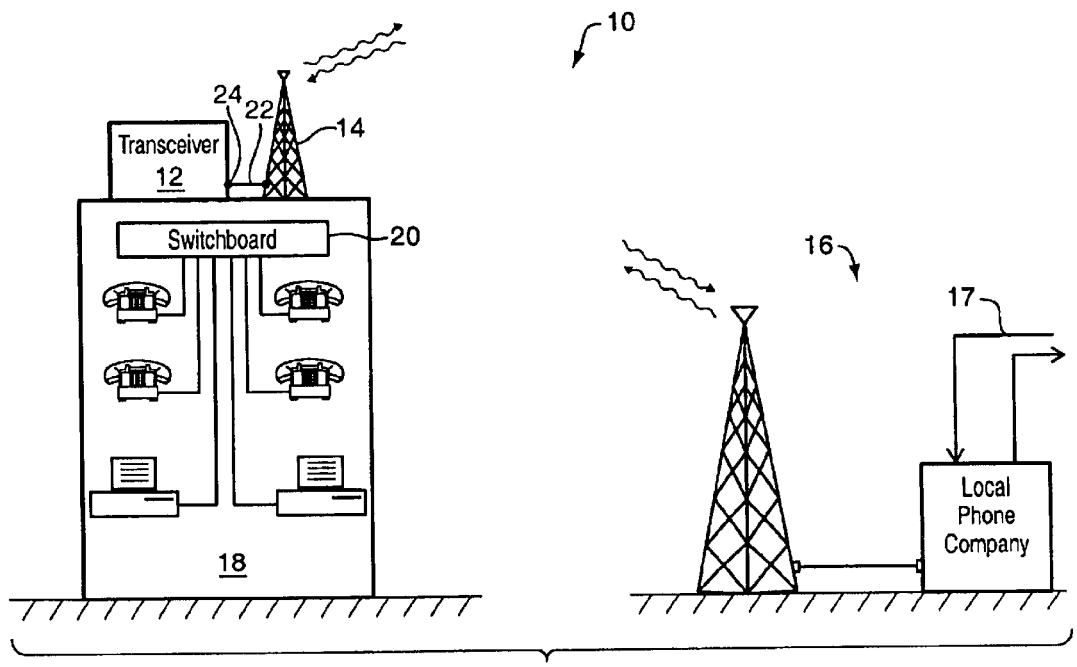
FIG. 1 is a diagram of a prior art transceiver system which utilizes a stand alone antenna system.

Referring now to the drawings, FIG. 1 depicts an example of a known wireless transmission system 10 as is known in the wireless communications industry. This system utilizes a transceiver unit 12 and antenna 14. A local hard-wired telephone network 18 including a switchboard 20 is set up in a particular building or within a particular company. This network of phone and data communications lines link the individual phones and computers together with physical transmission lines such as copper twisted pair phone lines, fiber-optic lines or an alternate type of hard wired communications link. While communicating within the local network 18, data or voice signals never leave the confines of the local hard wiring. However, if someone within the local network 18 needs to communicate with someone outside the network, they must have access to a local service provider. With a wireless local loop system as that depicted in FIG. 1, the hardwiring between the local network and the phone company is eliminated and in its place is put a transceiver 12 and antenna 14. The transceiver 12 takes the voice or data information that is generated by someone within the local network 18 and converts it into a radio frequency signal which can be wirelessly broadcast. The antenna 14 serves to launch the signal generated by the transceiver 12 and capture some of the signal emanated by the local phone company 16. By increasing the effective gain of the antenna 14, a greater range can be achieved. The service company 16 has a transceiver and antenna system to convert the radio signals back to a form that can be transmitted along a hard wired distribution network. The transceiver 12 and antenna 14 receive information being broadcast from the service company 16 so that a two way communication system is in operation between the users in the local network 18 and all those linked to the service company's network 16.

In FIG. 1, the antenna 14 used in the wireless system is a stand alone unit and is separate from the transceiver unit 12. This type of antenna can take the form of a larger tower structure or the antenna can be on a smaller scale such as a telescoping mast or a panel attached to the outside of the transceiver 12 or building. In either case a cable 22 connects the transceiver 12 to the antenna 14. Additionally, connection devices 24 establish a coaxial connection between the antenna elements and the circuitry internal to the transceiver 12.

Figure 2:
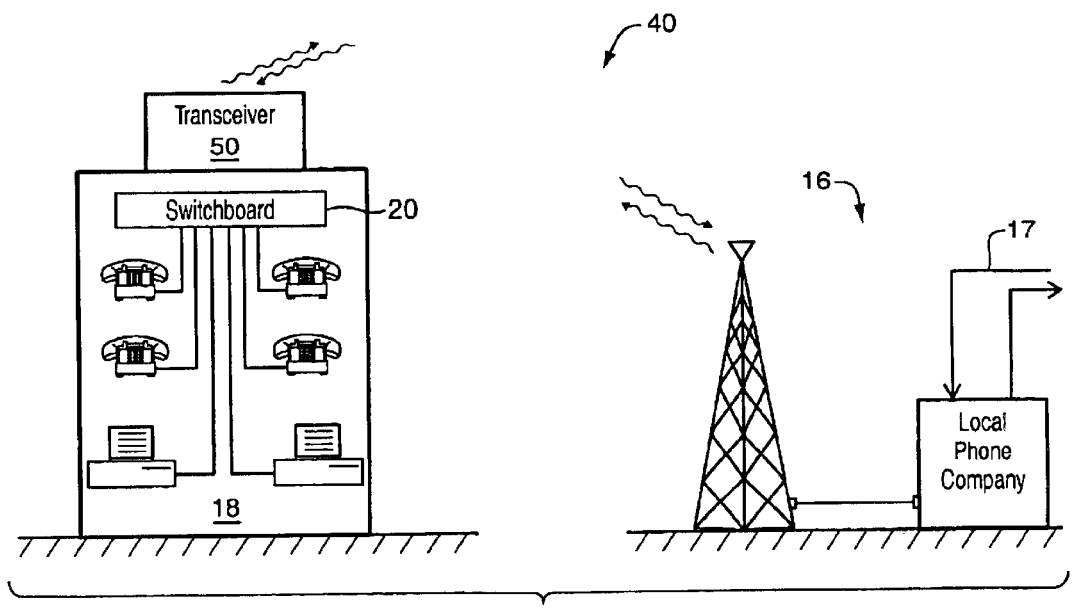
FIG. 2 is a diagram of a wireless communication system incorporating the present invention.

Referring now to FIG. 2, a diagram of a wireless system 40 embodying the present invention is shown. The principle of operation is similar to that described in FIG. 1 in that signals are received and broadcast via a transceiver 50 to and from a service company 16. In the present invention, a preferred embodiment of which is shown in FIG. 2, the transceiver 50 is housed within a radiating enclosure, eliminating the need for a separate external antenna as described in the system of FIG. 1. In the present invention, a transceiver unit 50 and radiating enclosure receive and transmit voice and data signals from a telephone network 18 to enable the users within the network 18 to communicate with users outside of the network via the service company's network of distribution lines 17.

Figure 3:
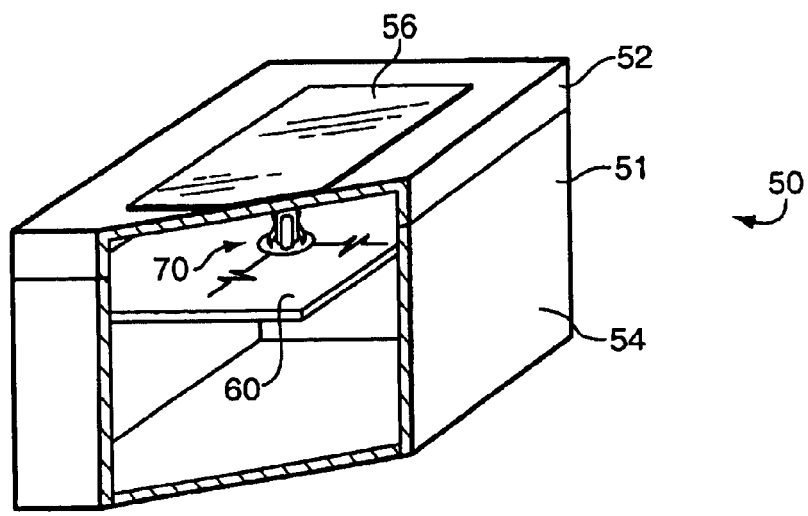
FIG. 3 is a cutaway perspective view of an embodiment of the present invention.

Referring now to FIG. 3, the radiating enclosure 51 of the present invention is described in greater detail. The transceiver unit 50 is housed within radiating enclosure 51. In a preferred embodiment, the radiating enclosure 51 is in the shape of a rectangular box or some other ergonomically acceptable shape. The radiating enclosure is formed from a cover portion 52 and a container portion 54. The cover portion 52 can be removed from the container portion 54 so that the internal printed circuit board 60 and other operating electronics of the transceiver 50 are revealed. The radiating enclosure 51 is preferably constructed from a thermoplastic resin that can be utilized in an injection molding process. This allows the radiating enclosure to be formed in whatever shape is necessary to adequately enclose and protect the transceiver circuitry and can be easily and inexpensively adapted to fit many different transceiver circuitry configurations. It is not necessary that the radiating enclosure be formed into a specific shape nor is it necessary that the radiating enclosure have flat surfaces. The chosen thermoplastic resin which forms the radiating enclosure serves as a dielectric. Therefore, it is preferable to select a material, such as polycarbonate, which has acceptable radio frequency characteristics.

With continuing attention to FIG. 3, radiating element 56 is shown affixed to the exterior surface of the cover portion 52. The radiating element 56 forms the active portion of the radiating enclosure system and, in a preferred embodiment, is made from copper, but can be manufactured from a variety of other conductive substances. FIG. 3 shows one radiating element 56 applied to radiating enclosure 51, however, more than one radiating element 56 may be used on the exterior of the housing 51 to provide a larger signal gain or the capability to have a multi-mode antenna. These and additional alternate embodiments are described in more detail below.

In a preferred embodiment as shown in FIG. 3, the radiating element 56 takes the form of a thin sheet of copper which is adhesively applied to the radiating enclosure 51. This copper sheet can either have an adhesive backing or a separate adhesive material can be applied during the assembly of the enclosure. Alternatively, the radiating element 56 can be applied to the transceiver housing by another method such as a metal deposition or printing process.

The components of a radiating enclosure 51 include a thin flat metallic region typically called the radiator, a dielectric substrate, a groundplane which is usually much larger than the radiator and a feed which supplies or receives the radio frequency (RF) power. In the present invention, the interior surface of the radiating enclosure 51 is coated with a groundplane material 100 (shown in FIG. 4). The radiating enclosure 51 which encloses the transceiver circuitry serves as the dielectric component. Radiating enclosure 51 is connected to the internal circuitry of the transceiver system by a connection device, shown generally as 70 in FIG. 3. The connection device 70 transfers the radio frequency power between the transceiver circuitry and the radiating enclosure 51. The connection device 70 is preferably a reversibly engaging device which can be repeatedly connected and disconnected allowing the cover portion 52 to be removed from the container portion 54.

The radiating enclosure 51 of the present invention serves as both the protective casing for the internal transceiver circuitry 50 as well as a dielectric component. The groundplane material 100 on the interior surface of the radiating enclosure 51 functions both as an EMI shield for the transceiver circuitry and as a groundplane component.

While the radiating element 56 and the groundplane component 100 are shown as essentially planar elements, it is not necessary that these components have such a configuration. The radiating element 56 and the groundplane material 100 can have a rounded or a curved shape as long as they are separated by a relatively constant distance.

Figure 4:
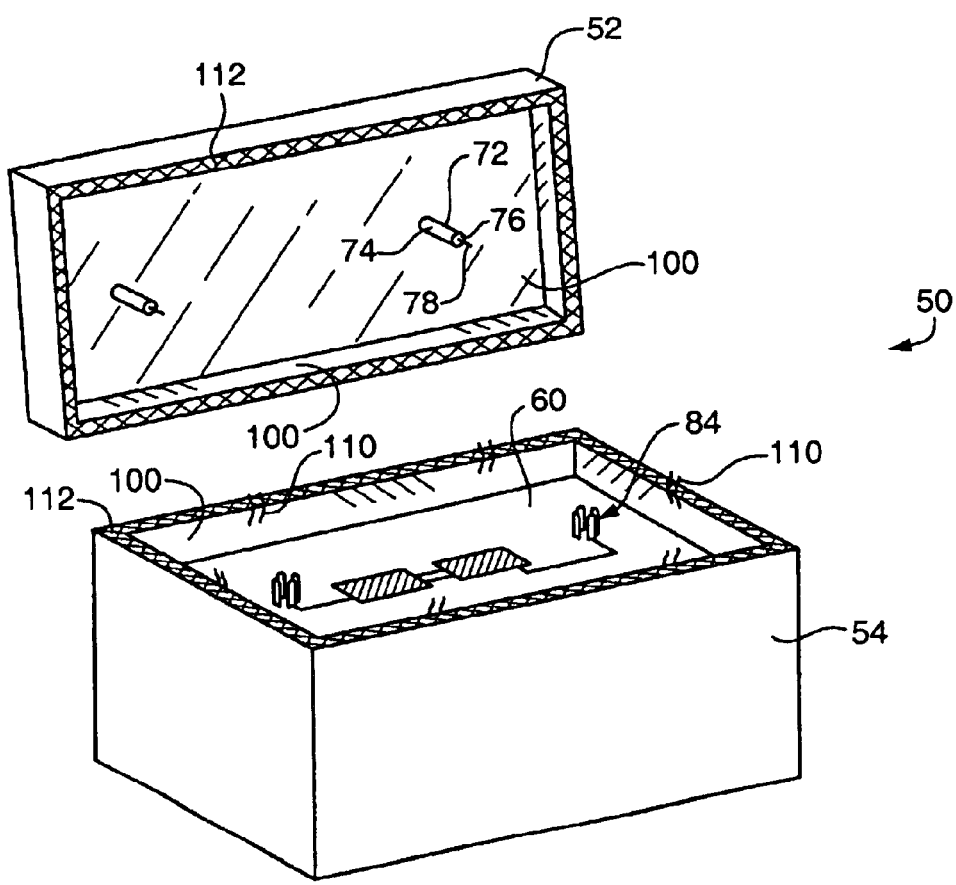
FIG. 4 is a perspective view of a transceiver embodying the present invention with the transceiver housing open.

Referring now to FIG. 4, the radiating enclosure 51 is shown in a partially disassembled configuration. The cover portion 52 is removed from the container portion 54 so that the details of its construction can be better described. The cover portion 52 is fabricated from a dielectric material such as the thermoplastic resin previously described. The particular material used and the thickness of the dielectric enclosure is predetermined based on the desired performance of the antenna system and the specific application. At least one boss 72 is integrated into the structure of the cover portion 52 and is fabricated from the same dielectric material as the cover portion 52. This boss is preferably formed during the manufacture of the cover portion 52 itself. However, the dielectric boss 72 can be applied separately after the cover portion 52 is produced. The boss 72 protrudes in an essentially normal direction from the interior surface of the cover portion 52 and extends toward the interior of the radiating enclosure 51 when the cover portion 52 and container portion 54 are joined. The boss 72 will form a portion of the connection between the radiating element 56 and the printed circuit board 60 of the transceiver circuitry, therefore it is preferred that the boss 72 have an essentially circular cross section since many industry standard coaxial connection components are manufactured to mate with a circular cable.

The metalized groundplane material 100 is uniformly applied to the interior surfaces of the radiating enclosure 51 including both the cover portion 52 and the container portion 54, where all walls of the interior surface of radiating enclosure 51 are covered with a groundplane material 100. A similar type of metalized material is typically applied to the interior surfaces of known transceiver enclosures but for the exclusive purpose of shielding the circuitry so that it will not create electromagnetic interference (EMI). The present invention also uses this metalized material to provide EMI shielding but additionally uses it as an integrated component in the radiating enclosure 51, specifically the groundplane element. The surface 74 of the dielectric boss is also covered with the same metalized groundplane material 100. The end surface 76 of the boss 72 is not coated with the groundplane material 100. The groundplane material 100 is preferably applied in a spray on process conducive to a mass production operation or by electro-deposition. The groundplane material 100 should have a relatively constant thickness and consistent covering throughout the interior surface of the radiating enclosure 51.

A conductor 78 is longitudinally located along the central axis of boss 72. Conductor 78 is preferably formed from a semi-rigid material. Conductor 78 is preferably formed from a semi-rigid material. Conductor 78 extends laterally through the center of boss 72 and protrudes beyound the exterior surface of the cover portion 52. Further details of the conductor 78 are described in conjunction with FIG. 5.

When assembled, the groundplane material 100, which is on the interior surfaces of cover portion 52 and container portion 54, forms a continuous conductive surface. A conductive link 110 is positioned between the groundplane layers 100 on the cover and container portions 52 and 54 of housing 51 to provide conduction between the conductive material of the cover portion 52 and the conductive material of the container portion 54. In a preferred embodiment, the conductive links 110 are spring biased metal clips which maintain a positive force on the interior surface of upper portion 52. A conductive gasket, mesh or polymer 112 may also be place in between the cover and container portions 52 and 54 in order to form a more continuous conductive surface. The conductive link 100 may also be comprised of interlocking conductive pins to complete the electrical connection between the groundplane surfaces of the cover and container portions 52 and 54.

To form a connection between the active radiating element 56, the groundplane material 100 and the transceiver printed circuit board 60, a connection port shown generally as 84 is incorporated directly onto the transceiver printed circuit board 60. The connection port 84 is positioned on the printed circuit board 60 so that when the cover portion 52 is joined with the container portion 54, the boss 72 and the conductor 78 are concentrically aligned with the connection port 84. When the cover surface 52 is joined with the container surface 54, the boss 72 and conductor 78 are automatically engaged with the connection port 84.

The connection port 84 has two separate contact areas, one which contacts the lateral surface of the boss 72 and one which contacts the conductor 78. Therefore, when assembled, a coaxial connection is formed from the radiating elements 56 and groundplane 100 to the transceiver printed circuit board 60.

Figure 5:
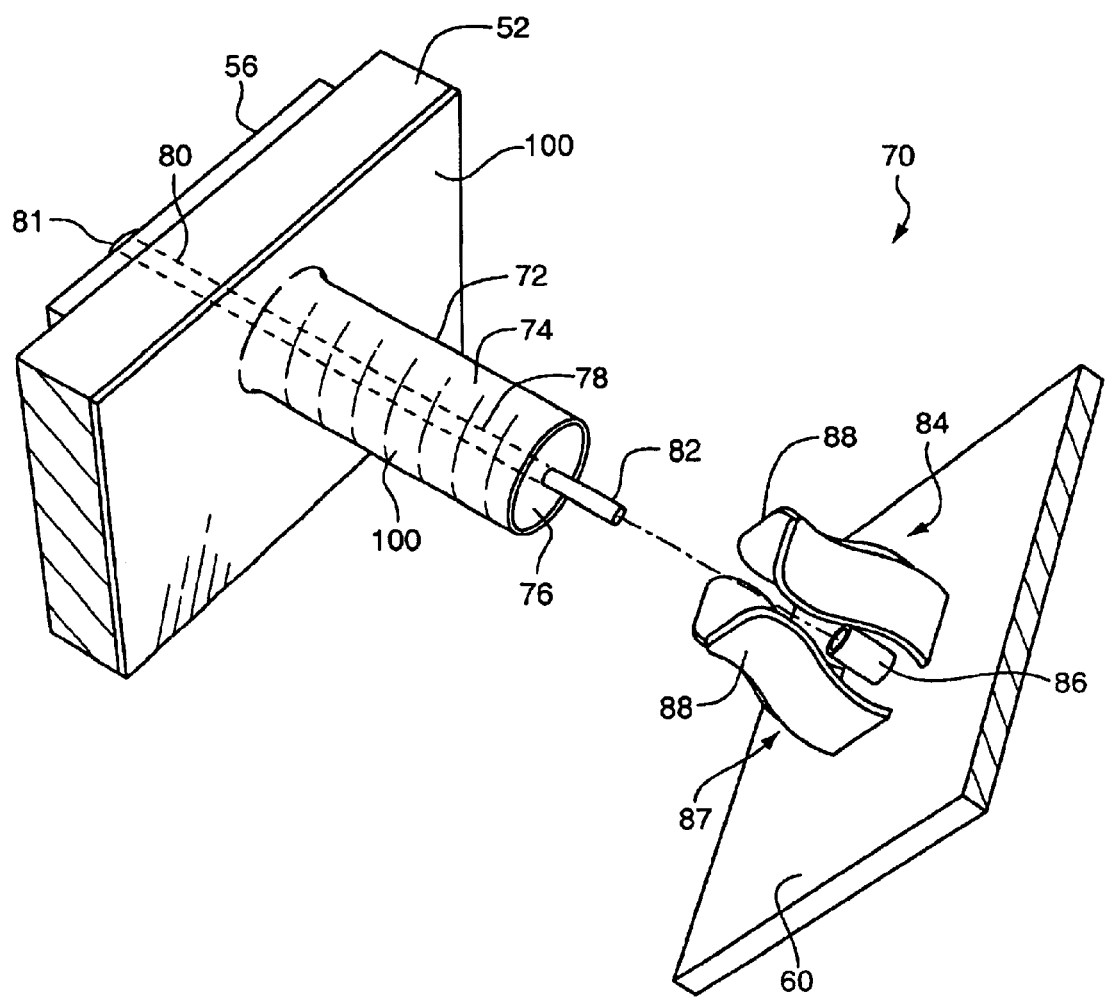
FIG. 5 is a perspective view of a connection device of the present invention.

With attention now on FIG. 5, a more detailed view of the integrated coaxial connection mechanism shown generally as 70, is shown. The coaxial connection is automatically completed when the boss 72 is pressed into the connection port 84. The connection port 84 is directly incorporated into the printed circuit board 60 and provides the feed for radio frequency power to the transceiver circuitry. The printed circuit board is one of several electronic devices which are housed in the container portion 54 of radiating enclosure 51.

FIG. 5 shows a cutaway portion of the cover portion 52 at an area where the radiating element 56 is attached to the exterior surface of the cover portion 52. The diameter of the boss 72 is sufficient to provide adequate insulation between the elongate conductor 78 and the groundplane coating 100 on the lateral surface 74 of boss 72. Additionally, the diameter of boss 72 is coordinated to engage securely with connection port 84. The diameter of the boss 72 and conductor 78 are chosen to effect the desired impedance characteristic of the coaxial line. The proximal end 80 of the conductor 78 preferably includes a fastening cap 81 which presses against the radiating element 56 when the conductor is inserted through the boss. The cap 81 provides a more consistent and secure electrical connection between the conductor 78 and the radiating element 56. In an alternate embodiment, the conductor 78 is molded into the boss during an injection molding process and the proximal end of the conductor terminates within the dielectric material of cover portion 52 and does not come into contact with radiating element 56. In this case, the electrical connection to the radiating element 56 would be formed by the capacitance between the conductor 78 and the radiating element 56. This embodiment has the benefit of eliminating the step of inserting the conductor 78 through the boss 72 since the conductor 78 can be incorporated during the production of the dielectric enclosure.

In a typical application, the end 82 of conductor 78 extends about 5–7 millimeters beyond the perpendicular surface of the boss 72. This extension distance is enough so that the end 82 of conductor 78 can form a secure contact with the center pin contact 86.

Connection port 84 includes two sets of contacts shown generally as 86 and 87. Simultaneously contacting each other of the contacts 86 and 87 forms a coaxial connection to the radiating enclosure 51. Center pin inner contact 86 is centrally located in the connection port 84 and is aligned so that the end 82 of the conductor 78 will be conductively engaged within the center pin inner contact 86 when the cover portion 52 is joined to the container portion 54. The center pin inner contact element 86 includes a spring biased chamber which maintains a positive force on the end 82 of the conducting pin 78 when the boss 72 is engaged with the connection port 84.

Outer contact element 87 is preferably formed from four conductive contact bars 88. The conductive contact bars 88 are spring biased toward the center of connection port 84 so that they will maintain a positive force against the metalized lateral surface 74 of the boss 72 when the cover portion 52 is engaged with the container portion 54 and the printed circuit board 60. The boss 72 and conductor 78 can be threaded, allowing the cover portion to be screwed into the container portion.

Figure 6A:
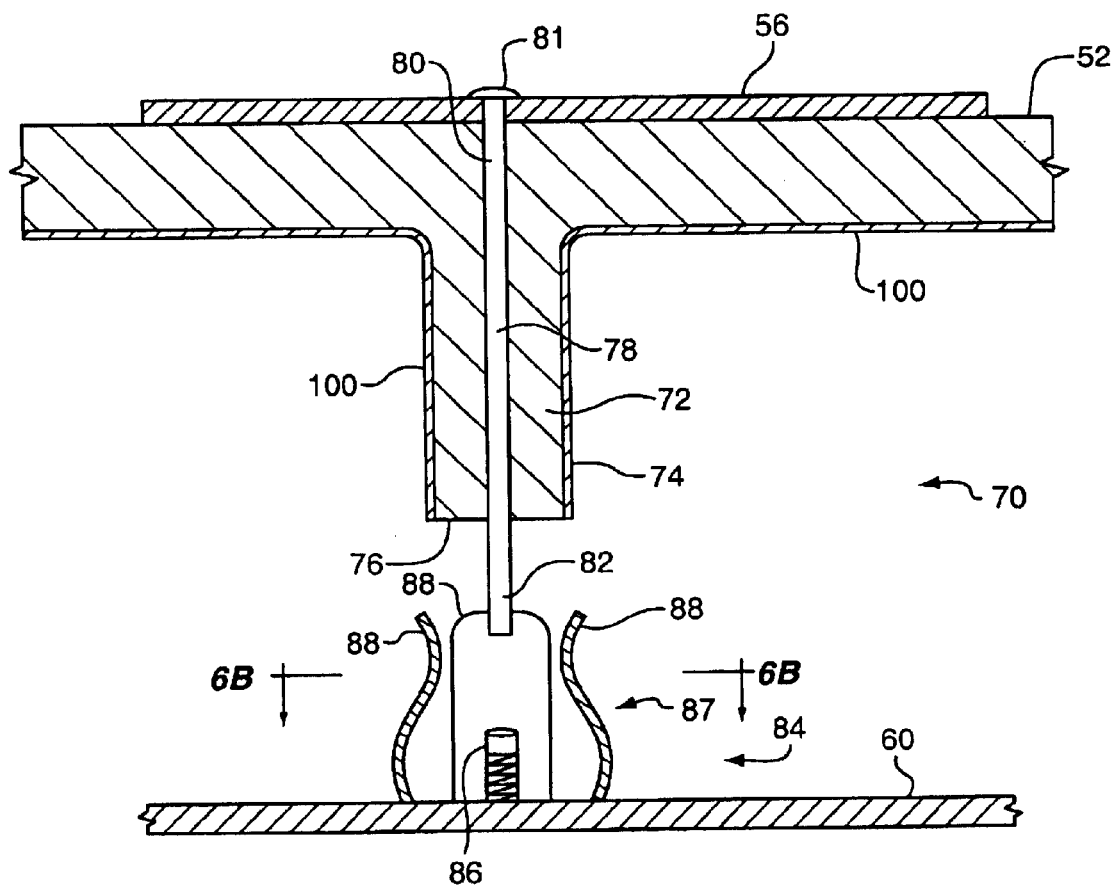
FIG. 6A is a partial cross sectional view of a transceiver embodying the present invention.
Figure 6B:
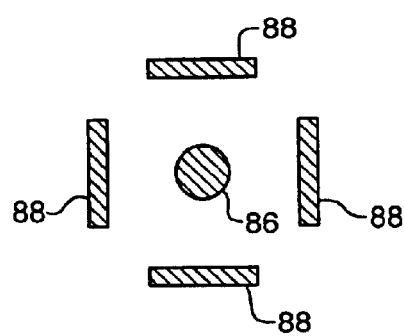
FIG. 6B is a sectional view of FIG. 6A along section line 6B—6B.

FIGS. 6A and 6B show a cross section of the integrated coaxial connection mechanism 70 including the cover portion 52, the printed circuit board 60 and the connection port 84 at an area where the boss 72 and the radiating element 56 are located. The printed circuit board 60 is one of the internal operating components of the transceiver 50. In a preferred embodiment, the conductor 78 has a cap 81 which secures the conductor 78 against the radiating element 56 and provides a more consistent electrical contact.

The center pin inner contact element 86 has a spring biased chamber so that positive force will be continuously maintained with the end 82 of the conducting pin 78 when the cover portion 52 is engaged with the container portion 54 and the printed circuit board 60.

The conductor 78 and boss 72 can be configured so that the conductor does not extend beyond the perpendicular surface of the boss but rather is recessed within the dielectric material of the boss 72. This type of arrangement allows for a flush mounted center pin connection, with the perpendicular surface of the boss 72 resting securely against the surface of the printed circuit board 60.

Figure 7:
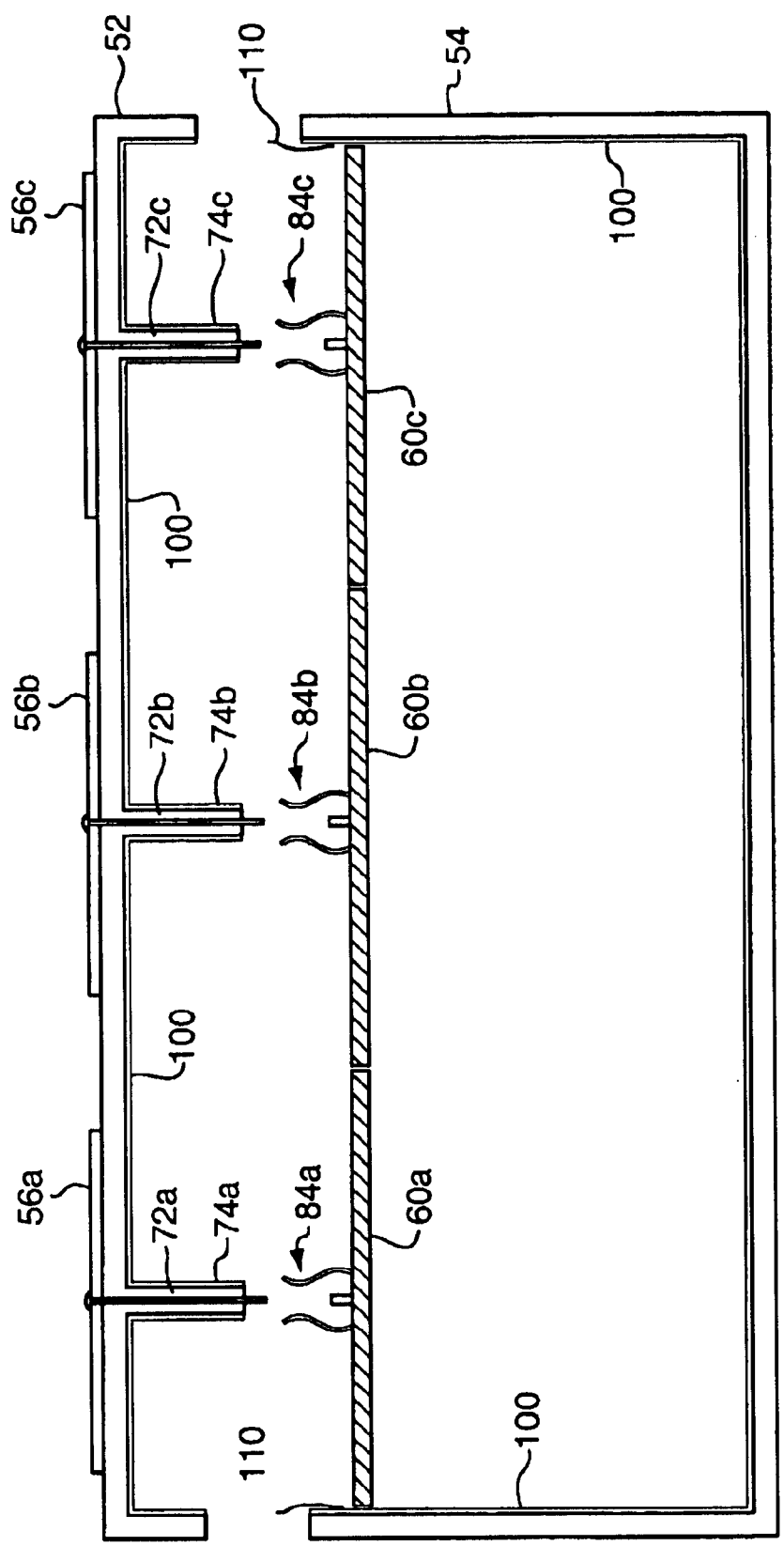
FIG. 7 is a cross section of a transceiver embodying multiple radiating elements in the same radiating enclosure.

In FIG. 7, separate radiating elements 56a, 56b and 56c of the present invention are shown as being incorporated into the same radiating enclosure 51. The connection between the radiating elements 56a, 56b and 56c and the printed circuit boards 60a, 60b and 60c are accomplished as previously described in conjunction with FIGS. 5 and 6, and all three connections are simultaneously made when the cover portion 52 is joined to the container portion 54. FIG. 7 also shows the groundplane material 100 covering the interior surfaces of cover portion 52, container portion 54 and the surfaces 74a, 74b and 74c of bosses 72a, 72b and 72c. This metalized coating extends throughout the entire enclosure to provide EMI shielding to the transceiver circuitry as well as the grounding elements for the three separate antenna systems.

The type of arrangement shown in FIG. 7 can be used for a selectable transceiver system in which an operator can choose which radiating element 56 to use. Alternatively, three separate systems can utilize one radiating enclosure 51 or one radiating element can be dedicated to transmission functions and one can be dedicated to reception functions. By combining three radiating elements 56 into the same radiating enclosure 51, production costs and space allocation may be reduced. Any number of radiating elements systems are contemplated by the present invention. FIG. 7 is only meant to be representative of the multi-mode capabilities of the present invention.

Other alternate embodiments that are contemplated by the present invention include the use of the radiating element to house hand held communication devices such as cellular phones and pagers, portable computers and personal digital assistants (PDA) with wireless modems.

Although the invention has been described and illustrated in the above description and drawings, it is understood that this description is by example only and that different embodiments may be made without departing from true spirit and scope of the invention. The invention therefore is not to be restricted, except within the spirit and scope of the following claims.

What is claimed is:

1. A radiating enclosure, comprising:
   a dielectric housing having first and second detachable housing portion, each of said first and second housing portions having an inner surface and an outer surface, the dielectric housing capable of receiving a transceiver system when mouted in the dielectric housing;
   at least one radiating element disposed on the exterior surface of said first housing portion;
   a connection device to establish an electrical connection between said at least one radiating element and the transceiver systems; and
   ground plane material distributed substantially on the entirety of the interior surface of said first housing portion, said ground plane material to be electrically coupled to the transceiver system.

2. The radiating enclosure of claim 1, wherein said ground plane material is configured to prevent lectromagnetic interference from substantially escaping said dielectric housing.

3. The radiating enclosure of claim 1, wherein said at least one radiating element is formed from a thin sheet of conductive material adhesively applied to the exterior surface of said first housing portion.

4. The radiating enclosure of claim 1, wherein said at least one radiating element is formed on the exterior surface of said first housing portion by an electro-deposition process.

5. The radiating enclosure of claim 1, wherein said at least one radiating element is printed on the exterior surface of said first housing portion.

6. The radiating enclosure of claim 1, further comprising a protective covering over said at least one radiating element.

7. The radiating enclosure of claim 1, wherein said dielectric housing is formed through an injection molding process.

8. The radiating enclosure of claim 1, wherein the dielectric housing is further capable of receiving a plurality of transceiver systems, said ground plane material to be electrically coupled to said plurality of transceiver systems.

9. The radiating enclosure of claim 1, wherein said dielectric housing is essentially in th shape of a rectangular box.

10. The radiating enclosure of claim 1, wherein said at a least one radiating element has an essentially planar shape.

11. The radiating enclosure of claim 1, wherein said at least one radiating element has a curved shape.

12. A radiating enclosure, comprising:
    a dielectric housing having first and second detachable housing portions, each of said first and second housing portions having an inner surface and an outer surface, the dielectric housing capable of receiving a plurality of transceiver systems when mounted in the dielectric housing;
    a plurality of radiating elements disposed on the exterior surface of said first housing portion;
    a plurality of connection devices to establish a plurality of electrical connections between said plurality of radiating elements and the plurality of transceiver systems; and
    ground plane material distributed substantially on the entirety of the interior surface of said housing portion, said ground plane material to be electrically coupled to the plurality of transceiver systems.

13. The radiating enclosure of claim 12, wherein said ground plane material is configured to prevent electromagnetic interference from substantially escaping said dielectric housing.

14. The radiating enclosure of claim 12, wherein each of said plurality of radiating elements is formed from a thin sheet of conductive material adhesively applied to the exterior surface of said first housing portion.

15. The radiating enclosure of claim 12, wherein each of said plurality of radiating elements is formed on the exterior surface of said first housing portion by an electro-deposition process.

16. The radiating enclosure of claim 12, wherein each of said plurality of radiating elements is printed on the exterior surface of said first housing portion.

17. The radiating enclosure of claim 12, further comprising a protective covering over said plurality of radiating elements.

18. The radiating enclosure of claim 12, wherein said dielectric housing is formed through an injection molding process.

19. The radiating enclosure of claim 12, wherein said dielectric housing is essentially in the shape of a rectangular box.

20. The radiating enclosure of claim 12, wherein each of said plurality of radiating elements has an essentially planar shape.

21. The radiating enclosure of claim 12, wherein each of said plurality of radiating elements has a curved shape.

* * * * *

UNITED STATES PATENT AND TRADEMARK OFFICE
CERTIFICATE OF CORRECTION

PATENT NO. : 6,897,373 B2
DATED : May 24, 2005
INVENTOR(S) : Barabash

It is certified that error appears in the above-identified patent and that said Letters Patent is hereby corrected as shown below:

Column 8,
Line 18, delete "lectromagnetic" and insert -- electromagnetic --.
Line 59, delete "th" and insert -- the --.

Signed and Sealed this

Sixteenth Day of August, 2005

JON W. DUDAS
*Director of the United States Patent and Trademark Office*